United States Patent [19]

Krug

[11] Patent Number: 4,961,053

[45] Date of Patent: Oct. 2, 1990

[54] CIRCUIT ARRANGEMENT FOR TESTING INTEGRATED CIRCUIT COMPONENTS

[76] Inventor: Heinz Krug, c/o Akademie Meru, Station 24, NL-6063 Vlodrop, Netherlands

[21] Appl. No.: 258,095

[22] Filed: Oct. 14, 1988

Related U.S. Application Data

[63] Continuation of Ser. No. 888,460, Jul. 21, 1986, abandoned.

[30] Foreign Application Priority Data

Jul. 24, 1985 [DE] Fed. Rep. of Germany ....... 3526485

[51] Int. Cl.⁵ ............................................. G01R 31/28
[52] U.S. Cl. .................................. 324/158 R; 324/73.1; 371/25.1; 437/8
[58] Field of Search ............ 324/73 PC, 73 R, 158 R, 324/158 T, 73.1; 371/15, 25, 25.1; 357/40; 437/8

[56] References Cited

U.S. PATENT DOCUMENTS

| | | | |
|---|---|---|---|
| 4,038,648 | 7/1977 | Chesley | 324/73 PC |
| 4,243,937 | 1/1981 | Multani et al. | 324/158 T |
| 4,244,048 | 1/1981 | Tsui | 324/73 R |
| 4,357,703 | 11/1982 | Van Brunt | 371/15 |
| 4,479,088 | 10/1984 | Stopper | 324/73 R |
| 4,583,179 | 4/1986 | Horii et al. | 324/73 R |
| 4,594,711 | 6/1986 | Thatte | 371/25 |
| 4,635,261 | 1/1987 | Anderson et al. | 371/25 |
| 4,703,436 | 10/1987 | Varshney | 437/8 |

FOREIGN PATENT DOCUMENTS 3130714 5/1982 Fed. Rep. of Germany .

OTHER PUBLICATIONS

Electron. Des. (U.S.A.); vol. 34; No. 12; Mar. 29, 1986; pp. 132-136.
Rupp, E. J., "Self-Testing..."; Proc. of the 1980 IEEE Int. Sym. on Circuits and Systems, IEEE 1980; pp. 261-264.
Tsui, F. F.; "In-Situ Testability..."; Proceedings of the IEEE; vol. 70; No. 1; Jan. 1982; pp. 59-78.
Hariharan et al; "Microprocessor..."; IEEE 1981 IECI Proc. 1981; pp. 302-306.
West, G. L.; "A Microcomputer Controlled..."; IEEE Trans. on IECI; vol. IECI-27; No. 4; Nov., 1980; pp. 279-283.
Pittampalli et al; "A Microcomputer...", IEEE Microcomputer Conf. Rec.; 1977; pp. 231-235.

Primary Examiner—Ernest F. Karlsen

[57] ABSTRACT

A circuit arrangement is provided for testing circuit components which are formed as integrated circuits on a common base plate and operable at the base plate by way of common feed lines and input lines. In the circuit arrangement, a testing circuit and switching stages are formed on the same base plate as integrated circuits, the switching stages are controllable by the testing circuit and inserted in connecting lines for connecting the testing circuit to the circuit components, and the testing circuit is equipped with an output circuit for delivering test results. The testing circuit is arranged for testing of the components without any other connections as the power supply connections. This self-testing is achieved by means of a central unit of the testing circuit by comparing of actual and desired values, distinguishing between faulty and faultless components and deciding of the respective functionality of the components in time sequence.

29 Claims, 2 Drawing Sheets

CIRCUIT ARRANGEMENT FOR TESTING INTEGRATED CIRCUIT COMPONENTS

This application is a continuation of application Ser. No. 888,460, filed July 21, 1986, now abandoned.

BACKGROUND OF THE INVENTION

The invention relates to a circuit arrangement for the testing circuit components which are formed as integrated circuits.

A circuit arrangement of this kind is described in "In-Situ Testability Design" by Frank F. Tsui Proceedings of the IEEE, Volume 70, No. 1, January 1982, pages 59 to 78. In this known circuit arrangement, a base plate (wafer) on which a plurality of integrated circuit components (chips) are formed is provided with many external connecting areas (pads) connected to individual or all circuit components. By way of an appropriate interface, a testing device is connected to these external connections. With the aid of this testing device, the circuit components on the base plate are then tested. In this arrangement, however, it is presumed that the circuit components are digital units in which, in addition to the constructional elements required for normal operation, additional constructional elements are integrated with control connections with which the circuit component for the test can be switched to a pseudo operating condition in which the functionality of all the constructional elements can be determined. Because of the additional constructional elements, a certain proportion of the useful surface at the circuit components becomes lost, the required additional connections reducing the number of connections that are actually useful during operation. By connecting the base plate to the interface of the testing circuit, the latter is occupied for the entire duration of the testing process so that the throughput of tested base plates is small unless the duration of testing is reduced at the expense of the resulting inaccuracies and incompleteness.

Other prior publications have suggested that each circuit component have its own testing circuit permanently built into it. This causes large proportions of area of the circuit components as well as the available external connections of the finished units to be lost. Further, these circuit components have to be tested individually, which is very time consuming. Errors are detected only in the final condition of the circuit component, so that many manufacturing steps required to reach the final condition result in a waste of time.

It is the object of the invention to develop the circuit arrangement for testing circuit components which are formed as integrated circuits so that economic testing is possible.

BRIEF DESCRIPTION OF THE INVENTION

In accordance with the present invention, the area required for the testing circuit in relation to the area required for the circuit to be tested is substantially reduced as compared with the prior art. Thus the production of self-testing integrated circuits is economized because the cost reduction for the testing exceeds by far the additional expenditures for the plus of integrated circuit area to be produced.

In the circuit arrangement according to one embodiment of the invention a specially adapted testing circuit is formed on the base plate of the circuit components. The testing circuit can be connected to the individual circuit components by way of respectively controlled switching stages and connecting lines on the base plate in order to carry out a respective testing step. The results of testing are delivered by means of an output circuit of the testing circuit. Consequently, only the base plate is connected to an appropriate power supply for the test, wherein the testing of the circuit components of the base plate can be conducted automatically. The easy connection therefore makes it possible to test in a rational manner and practically simultaneously a plurality of base plates or circuit components on base plates. The circuit components may be analog and/or digital circuits and need not contain special parts for testing purposes. Further, different types of circuit components may be formed on the same base plate. There is therefore no limitation as to a particular circuit type. The testing circuit formed on the respective base plate need only be designed for the required testing procedures and the accuracy demanded therefor. This represents a considerable simplification as compared with conventional test equipment in which various applications for different types of circuits and different testing requirements have to be taken into account. The testing circuit and the switching stages require a certain area on the base plate but the proportion of this area in comparison with the areas of the circuit components is relatively small. No alterations have to be made to the circuit components themselves for testing purposes so that no useful area is lost here and the number of connections available for actual operation is maintained. Simple simultaneous testing of the circuit components at a plurality of base plates by means of the circuit arrangement according to the invention is particularly advantageous if testing of the individual circuit components is very time consuming, such as in the case of memories with a high capacity, processor fields or the like.

BRIEF DESCRIPTION OF THE DRAWINGS

The invention will now be described in more detail with reference to examples illustrated in the drawing, wherein.

DETAILED DESCRIPTION OF THE INVENTION

Figure 1:
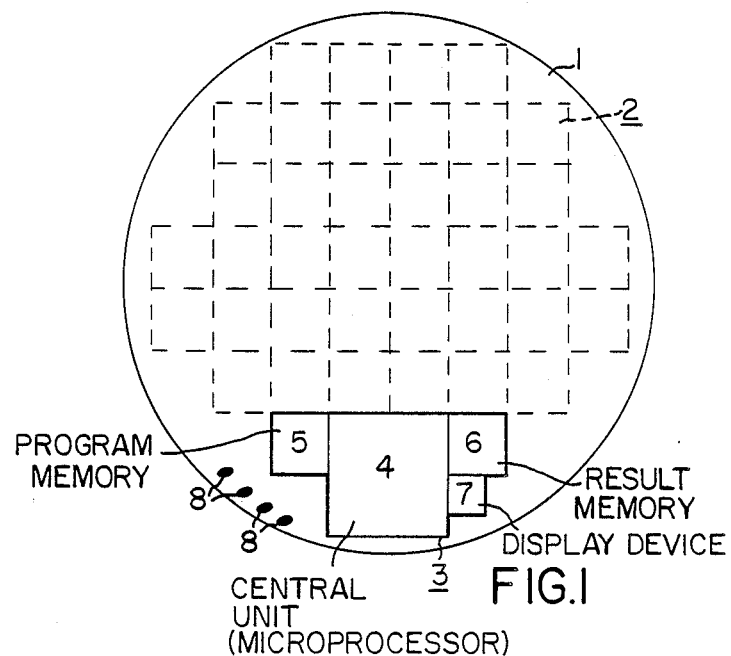
FIG. 1 is a plan view of an embodiment of circuit arrangement according to the invention.

FIG. 1 is a diagrammatic plan view of a base plate 1 on which a plurality of circuit components 2 to be tested are formed as integrated circuits. For the purpose of the test, a testing circuit 3 is formed on a part of the base plate 1 shown in this embodiment comprises a central unit 4, a program memory 5, and an output circuit with a result memory 6 and a display device 7. Further, the base plate 1 is formed with connecting areas 8 for external connection.

The base plate 1 is, for example, a semiconductor plate (wafer) conventionally used in semiconductor production. Depending on the nature of the circuit component to be formed thereon, the base plate 1 could also be any other substrate and have other shapes, for example rectangular. The circuit components 2 to be tested can be digital, analog or mixed digital/analog circuits. Depending on the desired functional principle, the circuit components 2 may entirely or partially contain super conductors, organic or biological switching elements, light wave conductors and the like. The circuit components may be designed for various functions, i.e., they can result in modules from a simple switching element or amplifier up to a memory of high capacity. If the circuit components 2 are to serve as non-volatile memories, they may first be in the form of programmable memories and then programmed to the desired permanent values in the course of testing or after testing. If the circuit component is in the form of a memory with spare cells, the latter can, if necessary, be switched so as to replace those cells which the test has found to be "bad".

The testing circuit 3 occupies a larger area on the base plate 1 than the individual circuit components 2 but it saves separate testing circuits which are built into every one of the circuit components and which together would occupy even a larger area and especially would reduce the number of functional elements of the circuit component.

The testing circuit 3 contains a microprocessor with the central unit 4 and the program memory 5. The central unit 4 contains interfaces for connection to the switching units 2 and, for the purpose of controlling these connections, oscillators for producing test signals, clock signals, control signals and the like, time generators for controlling the program execution etc. The central unit 4 may also contain a self-testing circuit and be provided with spare blocks or spare channels which can be connected as replacements if certain blocks or channels are discarded by reason of the self-testing result. The central unit 4 executes the testing program stored in the program memory 5. The testing program will depend on the nature of the circuit components to be tested, the kind of parameters to be tested, the desired accuracy and the like. Accordingly, appropriate program patterns can be prepared for the program memory 5 and these are used selectively with the circuit pattern of the central unit 4 remaining the same. Further, the testing circuit 3 contains the output circuit comprising the result memory 6 and display device 7. As in the case of the program memory 5, the result memory 6 can be designed depending on the circuit components to be tested and the testing criteria and, like the program memory, it can be selectively employed. The result memory 6 may store "good/bad" data, data on type of errors, data on quality ranges and the like, these being introduced as test results by way of the central unit 4. The test data are stored in the result memory 6 at predetermined storage positions which are associated with the respective circuit components 2. Preferably, the result memory 6 is in the form of a non-volatile memory such as a programmable read-only memory of which the stored contents can be recalled by the central unit 4, for example for the purpose of printing the test results or to make repairs or markings in accordance with the test results. If it is possible to repair faulty circuit components 2 on the base plate 1, for example by means of laser beams, the result memory 6 will be in the form of an erasable programmable memory (EPROM) which is erased after the completed repair and employed to store the results of a new test. The display device 7 serves to give a visible display of the test results to a desired extent. The display device 7 may be operated with the content of the result memory 6 or contain its own storage cells for certain test results, for example with respect to quality classes. Desirably, the display device 7 comprises at least one display element for each circuit component 2 to be tested, for example a light emitting diode or a fusible connection of which the molten condition can be detected optically. According to FIG. 1, the display elements of the display device 7 are combined into a display field in which the display elements are arranged in the same pattern as the circuit components 2. After completed testing, the display field may be evaluated automatically and/or by inspection with a magnifying glass or microscope in order to perform an error analysis, additionally mark faulty circuit components with ink, discard the entire base plate in the case of an excessive number of errors, and so on. Although this is not illustrated, instead of the display field or in addition thereto display elements may be arranged in the vicinity of the corresponding circuit component 2, which simplifies the allocation when evaluating the test results.

The connecting areas 8 on the base plate 1 serve for power supply of the circuit components 2 and the testing circuit 3 as well as for input and output of data. For example, by way of a respective connecting area 8, the content of the result memory 6 may be output for registration purposes or the like or the central unit 4 can be fed with a command for commencing the test, for executing a particular partial test or, in the case of certain test results, for executing an additional test.

Figure 2:
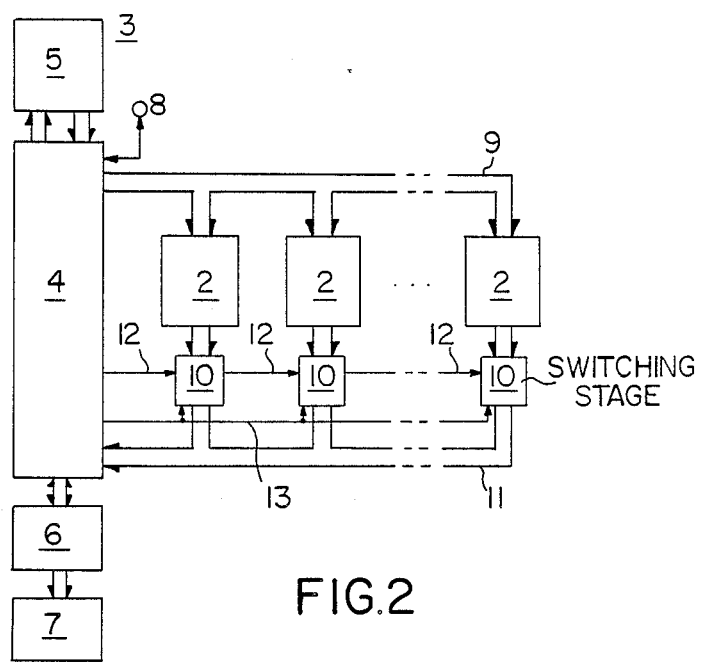
FIG. 2 is a schematic diagram of the circuit arrangement.

The testing circuit 3 is connected to the circuit components 2 by way of connecting lines and switching stages in the manner shown in FIG. 2. According to FIG. 2, an input bus 9 leads to the inputs of all circuit components 2 whilst the outputs of the circuit components are connected by way of a respective switching stage 10 under the control of the testing circuit 3 to a common output bus 11 which leads back to the central unit 4 of the testing circuit 3. The switching stages 10 are controlled by the central unit 4 by way of control lines 12 and 13. In the illustration of FIG. 2, the switching stages 10 are connected to form a chain circuit in the form of a shift register in which they are successively switched on and off by way of a control line 12 looped to form a stepping line. The control line 13 here serves to transmit clock signals for the stepping.

For testing a single circuit component 2, the appropriate switching stage 10 is switched on whilst all the other switching stages are switched off. The circuit component 2 receives through the input bus 9 certain input signals which should lead to appropriate output signals at the output bus 11. By the central unit 4, the testing circuit 3 detects whether the signals actually occurring at the output bus 11 correspond to the desired signals or are within the desired ranges.

Like switching stages 10 may also be connected between the bus 9 and the inputs of the circuit components 2 and be controlled respectively together with the appropriate switching stage 10 at the output of the circuit component. Thereby one can prevent an excessive load of the output stage of the central unit 4 driving the bus 9, arising from the many inputs to the circuit components 2.

Figure 3:
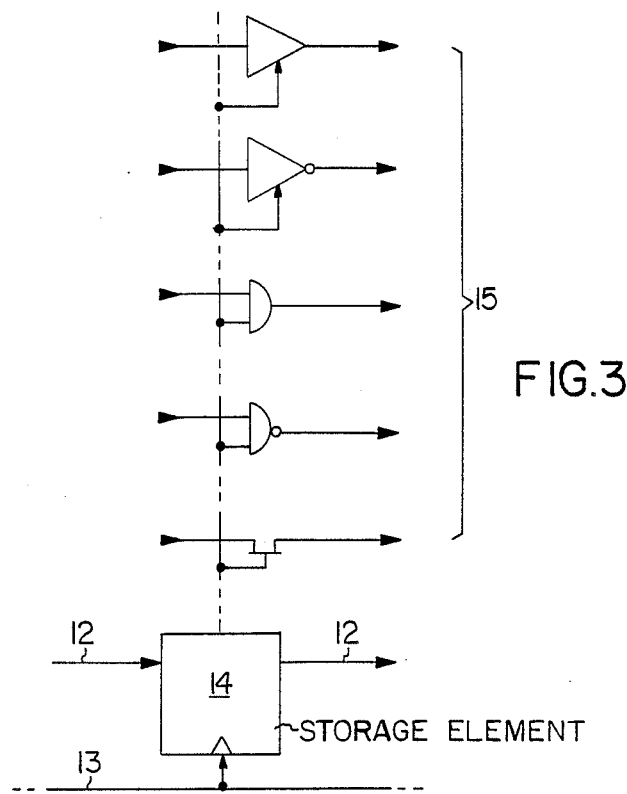
FIG. 3 shows one example for a switching stage of the circuit arrangement.

FIG. 3 diagrammatically illustrates an embodiment of the construction of a switching stage 10. The switching stage 10 contains a storage element 14 and at least one switching element 15. The storage element 14 is in the form of a flipflop which, in the complete circuit of FIG.

3, is part of the chain circuit and, depending on the switching condition of the preceding switching stage 10, is switched by way of the stepping line 12 under the control of clock signals at the control line 13. An output signal of the storage element 14 serves to switch the connected switching elements 15, a few examples of which are illustrated diagrammatically in FIG. 3. According to FIG. 3, a particular switching element 15 may be a switched buffer or amplifier, a switched inverter, an AND gate, a NAND gate or a switching transistor. The switching elements are in the form of analog or digital switching elements depending on the nature of the circuit components 2. Further, the switching stage 10, may contain a plurality of partial stages according to FIG. 3, which then give different testing conditions for successive testing steps, such as signal inversion, changes in level, signal combinations or the like.

Figure 4:
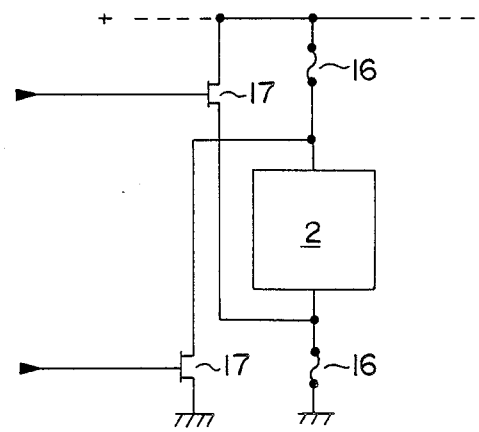
FIG. 4 shows one example for the power supply of a circuit component to be tested.

FIG. 4 shows the power supply for an individual circuit component 2. In the FIG. 4 example, each of the two power supply lines of the circuit component 2 includes a fusible link 16 which melts when the current consumption is excessive, such a molten condition preferably being recognizable optically. The links 16 serve as fuses for disconnecting a faulty circuit component 2 that would prevent the energization of all circuit components and thus make testing impossible. Further, FIG. 4 illustrates two switching transistors 17 by means of which, under the control of the testing circuit 3, a particular fusible link 16 can be intentionally fused by applying the supply voltage in order to mark a circuit component found to be faulty or preventing the test from being affected thereby, for example through "wild oscillations". Such fusible links 16 can also be provided in particular input and output lines of the circuit components 2 so that any short-circuits that arise will not make the central unit 4 inoperative. Further, instead of the fusible links 16 or in addition thereto one may provide other switching transistors (not shown) which under the control of the testing circuit 3 only one of the circuit components 2 or only one group thereof can be supplied with current in order to reduce the power consumption during testing.

The switching stages 10, the input and output busses 9 and 11 as well as the fusible links 16 and the switching transistors 17 are, together with power supply lines, desirably disposed at regions of the base plate 1 that are omitted when the base plate 1 is divided to obtain the individual circuit components by sawing, laser beam separation or the like. After dividing the base plate 1, one thereby obtains circuit components 2 which are tested and which only contain the constructional elements and connections necessary for their function.

FIG. 1 only shows an example of the arrangement for the testing circuit 3 in conjunction with the circuit components 2. Alternatively, the testing circuit 3 can be distributed along the periphery of the base plate 1 instead of at one side as in FIG. 1, arranged at the middle of the base plate 1 to require shorter leads, and when equipping the base plate 1 with different circuit components 2 be provided with different recallable program memories.

The circuit arrangement according to the preceding embodiment has been described with electric conductors and switching units for the testing of the circuit components for electric signals. In the same way, however, one can construct a circuit arrangement for testing circuit components in which use is at least partially made of light wave conductors, super conductors, organic conductors or the like. In that case, the respective connecting lines and switching elements of the circuit arrangement have to be appropriately formed.

The testing circuit 3 is shown in FIG. 1 as lying in a zone disposed beyond the circuit components 2 but parts of the testing circuit, for example testing signal amplifiers, digital buffers, range limit switches and the like, can also be disposed near the outputs or inputs of the circuit components in order thereby to eliminate error contributions caused by excessively long testing signal lines.

Various modifications in structure and/or function may be made by one skilled in the art to the disclosed invention without departing from the scope of the invention as defined by the claims.

What I claim is:

1. An arrangement for testing a plurality of circuit components forming an integrated circuit on a common base plate comprising:

testing circuit means common to each of the circuit components located in a region of the base plate independent of the circuit components for comparing output values of the circuit components with desired values for at least one test parameter, the testing circuit means being separable from the circuit components when the base plate is divided;

switching stages means on the base plate and controllable by the testing circuit means for connecting the testing circuit means to each of the circuit components; means for providing a common power supply to the testing circuit means and switching stages means;

the testing circuit means comprising an output circuit means for the output of test data, a central unit means for functionally testing the plurality of circuit components in accordance with a desired time sequence and for distinguishing between faulty and faultless circuit components with regard to the test parameter.

2. A circuit arrangement according to claim 1, wherein said testing circuit means comprises a program memory means and in central unit means a microprocessor.

3. A circuit arrangement according to claim 1 wherein said testing circuit means is designed for self-testing and contains equivalent circuit sections which can be switched on depending on the result of the self-testing.

4. A circuit arrangement according to claim 1, wherein the power supply means for each circuit component can be switched on and off by said testing circuit means.

5. A circuit arrangement according to claim 1, wherein the respective circuit components are connected to said power supply lines by way of fuses which fuse at an internal short circuit of the associated circuit component or are interruptable by applying the supply voltage by means of a transistor operated by said testing circuit.

6. A circuit arrangement according to claim 1, wherein said output circuit means comprises a result memory means with storage positions allocated to the respective circuit components for storing of information on the functionality of the associated circuit component.

7. A circuit arrangement according to claim 6, wherein said result memory means is in the form of a nonvolatile memory.

8. A circuit arrangement according to claim 6, wherein said result memory means can be read out by way of an external connection to said base plate.

9. A circuit arrangement according to claim 1, wherein said output circuit means comprises a display device means for visually displaying the test results.

10. A circuit arrangement according to claim 9, wherein said display device means comprises at least one display element for each circuit component, said display element being disposed near each associated circuit component or in a separate display field.

11. A circuit arrangement according to claim 10, wherein said display elements are light-emitting diodes or fusible connections the fused condition of which being recognizable visually.

12. A circuit arrangement according to claim 11, wherein said display elements are associated with nonvolatile storage cells.

13. A circuit arrangement according to claim 1, wherein said switching stages and/or connecting lines connecting said switching stages with said testing circuit are formed on a region of said base plate which separates from the base plate when said base plate is divided.

14. A circuit arrangement according to claim 1, wherein each switching stage means comprises a storage element and at least one switching element controlled thereby for switching one of connecting lines to the associated circuit component.

15. A circuit arrangement according to claim 14, wherein said storage elements are connected to form a chain circuit in which a switching-on storage condition can be shifted.

16. A circuit arrangement according to claim 1, wherein said switching stages means are at least partially formed for switching or conducting of electric signals or signals in the form of electromagnetic radiation.

17. A circuit arrangement according to claim 1, wherein circuit components found to be faulty by the test result of said testing circuit can be switched off temporary or permanently by control signals from said testing circuit at least at one common supply line and/or connecting line.

18. A circuit according to claim 7 wherein said result memory means can be read out by way of an external connection of said base plate.

19. A method for testing circuit components comprising the steps of:
forming on a common base plate a plurality of circuit components of an integrated circuit;
forming on the common base plate in a region independent of the circuit components a testing circuit common to each of the circuit components;
forming on the common base plate switching stages controlled by the test circuit for connecting the test circuit to each of the circuit components;
forming on the common base plate means for providing a common power supply to the testing circuit and the switching stages;
operating the test circuit via the switching stages to functionally test the plurality of circuit components by comparing output values of the circuit components with desired values for at least one test parameter in accordance with a desired time sequence so as to distinguish faulty and faultless circuit components; and
dividing the common base plate to separate the test circuit from the respective circuit components.

20. The method of claim 19 wherein the testing circuit can switch on and off the power supply of each circuit component.

21. The method of claim 19 comprising providing a fuse between the power supply line and the respective circuit component.

22. The method of claim 19 comprising providing a result memory with storage position allocated to the respective circuit component for storing information on the functionality of the associated circuit component.

23. The method of claim 22 comprising reading out the result memory by an external connection to the base plate.

24. The method of claim 19 comprising the step of providing a display of the output values.

25. The method of claim 19 comprising the step of providing at least one display for each circuit component.

26. The method of claim 19 wherein the switching stages are formed on a portion of the common base plate which separates from the base plate when the base plate is divided.

27. The method of claim 19 comprising providing in each switching stage a storage element and at least one switching element controlled by the storage element for switching one of the connections to the associated circuit component.

28. The method of claim 27 wherein the storage element is connected to form a chain circuit in which a switching-on condition can be shifted.

29. The method of claim 19 wherein circuit components found to be faulty can be switched off temporarily or permanently by control signals from the testing circuit at least at one common supply line and/or connecting line.

* * * * *